US009933876B2

(12) United States Patent
Day

(10) Patent No.: US 9,933,876 B2
(45) Date of Patent: Apr. 3, 2018

(54) METHODS AND SYSTEMS FOR IMPLEMENTING MODAL CHANGES IN A DEVICE IN RESPONSE TO PROXIMITY AND FORCE INDICATIONS

(71) Applicant: Synaptics Incorporated, San Jose, CA (US)

(72) Inventor: Shawn P. Day, San Jose, CA (US)

(73) Assignee: Synaptics Incorporated, San Jose, CA (US)

(*) Notice: Subject to any disclaimer, the term of this patent is extended or adjusted under 35 U.S.C. 154(b) by 145 days.

(21) Appl. No.: 14/924,355

(22) Filed: Oct. 27, 2015

(65) Prior Publication Data
US 2016/0048256 A1 Feb. 18, 2016

Related U.S. Application Data

(63) Continuation of application No. 11/289,155, filed on Nov. 28, 2005, now Pat. No. 9,182,837.

(51) Int. Cl.
*G06F 3/041* (2006.01)
*G06F 3/038* (2013.01)
(Continued)

(52) U.S. Cl.
CPC ............ *G06F 3/0414* (2013.01); *G06F 3/016* (2013.01); *G06F 3/038* (2013.01); *G06F 3/044* (2013.01);
(Continued)

(58) Field of Classification Search
CPC ...... G06F 3/0414; G06F 3/0416; G06F 3/044; G06F 3/045; G06F 3/046; G06F 3/047; G06F 3/048; G06F 3/0482
(Continued)

(56) References Cited

U.S. PATENT DOCUMENTS 3,089,985 A 5/1963 Camfield et al.
4,670,747 A 6/1987 Borras et al.
(Continued)

FOREIGN PATENT DOCUMENTS

EP 0 590 494 A1 4/1994
GB 2 243 117 A 10/1991
(Continued)

OTHER PUBLICATIONS

International Search Report for International Application No. PCT/US2006/042355, dated Oct. 31, 2007, 2 pages.
(Continued)

*Primary Examiner* — Alexander Eisen
*Assistant Examiner* — Nelson Lam
(74) *Attorney, Agent, or Firm* — FBFK PC

(57) ABSTRACT

Methods, systems and devices implement changes in operating mode for a media player, wireless telephone, portable computer or other device having a force sensor and a proximity sensor. A force indication is received from the force sensor and a proximity indication is received from the proximity sensor responsive to user input. The device is then switched from a second operating mode to a first operating mode in response to an occurrence of user input being indicated by both the force and proximity indications. A trigger event occurring during one of the operating modes evokes a response by the device that is not evoked by the trigger event in the other of the first and second operating modes.

17 Claims, 3 Drawing Sheets

(51) Int. Cl.
*H03K 17/94* (2006.01)
*H03K 17/945* (2006.01)
*H03K 17/955* (2006.01)
*G06F 3/01* (2006.01)
*G06F 3/044* (2006.01)
*G06K 9/00* (2006.01)
*H01H 3/02* (2006.01)

(52) U.S. Cl.
CPC ....... *G06F 3/0416* (2013.01); *G06K 9/00013* (2013.01); *H03K 17/94* (2013.01); *H03K 17/945* (2013.01); *H03K 17/955* (2013.01); G06F 2203/04103 (2013.01); G06F 2203/04106 (2013.01); H01H 2003/0293 (2013.01); H03K 2217/96062 (2013.01)

(58) Field of Classification Search
USPC .................................................. 345/156–184
See application file for complete search history.

(56) References Cited

U.S. PATENT DOCUMENTS

| | | | |
|---|---|---|---|
| 5,235,217 A | 8/1993 | Kirton | |
| 5,241,583 A | 8/1993 | Martensson | |
| 5,270,710 A | 12/1993 | Gaultier et al. | |
| 5,521,596 A * | 5/1996 | Selker | G06F 3/0338 341/20 |
| 5,666,113 A | 9/1997 | Logan | |
| 5,805,084 A | 9/1998 | Mannisto | |
| 5,812,954 A | 9/1998 | Henriksson | |
| 5,880,411 A | 3/1999 | Gillespie et al. | |
| 5,917,906 A | 6/1999 | Thornton | |
| 6,118,435 A | 9/2000 | Fujita et al. | |
| 6,234,651 B1 | 5/2001 | Kodama et al. | |
| 6,239,788 B1 * | 5/2001 | Nohno | G06F 3/0412 178/18.03 |
| 6,243,080 B1 | 6/2001 | Molne | |
| 6,449,492 B1 | 9/2002 | Kenagy et al. | |
| 6,704,005 B2 | 3/2004 | Kato et al. | |
| 6,861,961 B2 | 3/2005 | Sandbach et al. | |
| 7,091,886 B2 | 8/2006 | DePue et al. | |
| 7,292,232 B2 | 11/2007 | Ranta et al. | |
| 7,446,823 B2 | 11/2008 | Zheng | |
| 7,450,110 B2 | 11/2008 | Shahoian et al. | |
| 9,182,837 B2 * | 11/2015 | Day | G06F 3/038 |
| 2002/0049070 A1 | 4/2002 | Bick | |
| 2003/0030628 A1 | 2/2003 | Sato et al. | |
| 2005/0052425 A1 | 3/2005 | Zadesky et al. | |
| 2005/0078085 A1 | 4/2005 | Casebolt et al. | |
| 2005/0151727 A1 | 7/2005 | Kwong | |
| 2005/0275567 A1* | 12/2005 | DePue | H03K 17/94 341/32 |
| 2006/0038797 A1 | 2/2006 | Lapstun et al. | |
| 2006/0071912 A1 | 4/2006 | Hill et al. | |
| 2006/0114890 A1* | 6/2006 | Martin Boys | H04H 20/72 370/352 |
| 2006/0213924 A1* | 9/2006 | Ophardt | A47K 5/12 222/52 |
| 2006/0244733 A1 | 11/2006 | Geaghan | |
| 2008/0018611 A1* | 1/2008 | Serban | G06F 3/0416 345/173 |
| 2011/0102345 A1* | 5/2011 | Kim | G06F 3/04883 345/173 |
| 2011/0141053 A1* | 6/2011 | Bulea | G06F 3/0416 345/174 |
| 2011/0278078 A1* | 11/2011 | Schediwy | G01L 1/146 178/18.06 |
| 2011/0279409 A1 | 11/2011 | Salaverry et al. | |
| 2013/0018489 A1 | 1/2013 | Grunthaner et al. | |
| 2013/0100030 A1* | 4/2013 | Los | G06F 3/023 345/169 |
| 2013/0154933 A1* | 6/2013 | Sheik-Nainar | G06F 3/03543 345/163 |
| 2014/0022215 A1 | 1/2014 | Bulea | |
| 2014/0078107 A1 | 3/2014 | Bulea | |
| 2014/0240288 A1 | 8/2014 | Bulea | |
| 2014/0267128 A1 | 9/2014 | Bulea et al. | |
| 2014/0333579 A1 | 11/2014 | Sleeman et al. | |
| 2015/0002447 A1 | 1/2015 | Schediwy | |
| 2015/0070278 A1* | 3/2015 | Rehn | G06F 3/03543 345/163 |
| 2015/0084874 A1* | 3/2015 | Cheng | G06F 3/04883 345/173 |
| 2015/0084909 A1 | 3/2015 | Worfolk et al. | |
| 2016/0034092 A1* | 2/2016 | Schmitt | G06F 3/0416 345/174 |
| 2016/0048243 A1* | 2/2016 | Bulea | G06F 3/044 345/174 |

FOREIGN PATENT DOCUMENTS

| | | |
|---|---|---|
| GB | 2 314 739 A | 1/1998 |
| JP | 11-194863 | 7/1999 |
| JP | 11-194872 | 7/1999 |
| JP | 11-194883 | 7/1999 |
| WO | 02/35460 A1 | 5/2002 |
| WO | 02/35461 A1 | 5/2002 |
| WO | 04/107146 A2 | 12/2004 |

OTHER PUBLICATIONS

"The UnMouse User's Guide"; Version 4.0 for all PC computers; MicroTouch; Jan. 1990, pp. 1-42.

* cited by examiner

METHODS AND SYSTEMS FOR IMPLEMENTING MODAL CHANGES IN A DEVICE IN RESPONSE TO PROXIMITY AND FORCE INDICATIONS

CROSS-REFERENCE TO RELATED APPLICATION

The present application is a continuation application of and, thereby, claims benefit under 35 U.S.C. § 120 to U.S. application Ser. No. 11/289,155, entitled, "METHODS AND SYSTEMS FOR IMPLEMENTING MODAL CHANGES IN A DEVICE IN RESPONSE TO PROXIMITY AND FORCE INDICATIONS," filed on Nov. 28, 2005, issued as U.S. Pat. No. 9,182,837, and incorporated herein by reference.

TECHNICAL FIELD

The present invention generally relates to user interfaces, and more particularly relates to techniques and systems for changing an operating mode of a media player, wireless telephone, portable computer or other device based upon sensed proximity and force information.

BACKGROUND

Many media players, portable computers, personal digital assistants (PDAs), video game players, wireless phones and other devices now receive user inputs via proximity sensors. Typically, when a user places a finger, stylus or other input object near the proximity sensor, a capacitive, inductive, acoustic, optical, or other effect is produced that can be detected and correlated to the position of the object. This positional information can in turn be used to move a cursor or other indicator on a display screen, to scroll through text elements on the screen, or for any other user interface purpose. Although proximity sensors are readily implemented in many different types of devices, such sensors can be susceptible to accidental activation, as when a user unintentionally brushes a hand, finger, or other body part within the sensing region of the proximity sensor.

In addition to receiving proximity inputs, many devices include buttons or other sensors that detect an applied physical force. Such buttons and other force-sensitive inputs are also susceptible to accidental actuation that can result in undesired effects upon device operation. In a conventional media player, for example, an accidental bump against a table or other object can undesirably activate or deactivate the player itself, or could otherwise disrupt operation of the player. Such disruptions are particularly common (and particularly annoying) in devices that are intended to be portable, because such devices are often used in environments where they can be easily bumped or jostled.

To prevent accidental activation of force and/or proximity input sensors, many devices incorporate a mechanical "hold switch". When the switch is activated, inputs received at one or more sensors are ignored. While the hold switch can be effective in reducing the effects of undesired inputs, such switches typically add complexity to the user interface, requiring the user to remember to engage and disengage the hold switch at appropriate times. Such switches also add bulk, cost and increased mechanical complexity to the device. Further, mechanical switches can be difficult to effectively seal against environmental effects, thereby creating a potential avenue for dust, moisture or other pollutants to enter the device.

It is therefore desirable to provide new systems and techniques for implementing modal changes in a media player, portable computer, portable telephone or other device. Such systems and techniques should be easy to implement and use, and should not require significant additional mechanical complexity. Other desirable features and characteristics will become apparent from the subsequent detailed description and the appended claims, taken in conjunction with the accompanying drawings and the foregoing technical field and background.

BRIEF SUMMARY

According to various exemplary embodiments, new methods, systems and devices for changing the operating mode of a media player, wireless telephone, portable computer or other device process indications responsive to the user input that are received from a force sensor and a proximity sensor. The device is switched between operating modes in response to an occurrence of user input being indicated by both the force and proximity indications.

Using this broad concept, many different systems and methods can be developed and implemented to provide any number of benefits. For example, one of the operating modes can be a "hold" mode to implement "hold switch" functionality, wherein device inputs are processed differently in "hold" mode than they are processed in another mode. Similarly, force and proximity indications can be used to present "help window" information or the like. These and other exemplary embodiments are described in additional detail below.

BRIEF DESCRIPTION OF THE DRAWINGS

Various aspects of the present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

According to various exemplary embodiments, the operating mode of a media player, portable computer, wireless telephone or other device is switched in response to an occurrence of the user input being identified by both a proximity indication and a force indication. The proximity indication is provided by one or more proximity sensors, such as a capacitive, resistive, inductive, optical, infrared, ultrasound, sonic or other proximity sensor and is produced as a digital or analog function of the proximity of a user input object (e.g. a stylus, the user's finger or hand or the like). The force indication is provided by one or more force sensors such as a mechanical switch, strain gauge, load cell, piezoelectric force sensor, piezoresistive force sensor or the like as a digital or analog function of a physical force applied with the object. By switching the operating mode in response to both the applied physical force and the proximity of the input object, mode changes can occur implicitly as part of normal user interactions with the device, while those same mode changes remain immune to many types of accidental disturbance.

Such modal switching can be used to implement "hold-switch" functionality, for example, by having the device respond to trigger events such as button input, proximity input, force input, or the like in a "normal operation" mode but not in a "hold" mode. In such embodiments, accidental actuation of the force sensor by objects accidentally bumping against the device can be ignored or otherwise prevented from adversely affecting device behavior when the device is in the "hold" mode. When the device is returned to a normal operating mode, force and/or proximity indications of user input (or other trigger events) can be processed as appropriate. Further, because the device can be switched between operating modes through simple application of both force and proximity input, the need for a separate mechanical switch to select between such modes is reduced or eliminated. Other types of modal changes could be used in a wide variety of alternate embodiments.

Figure 1:
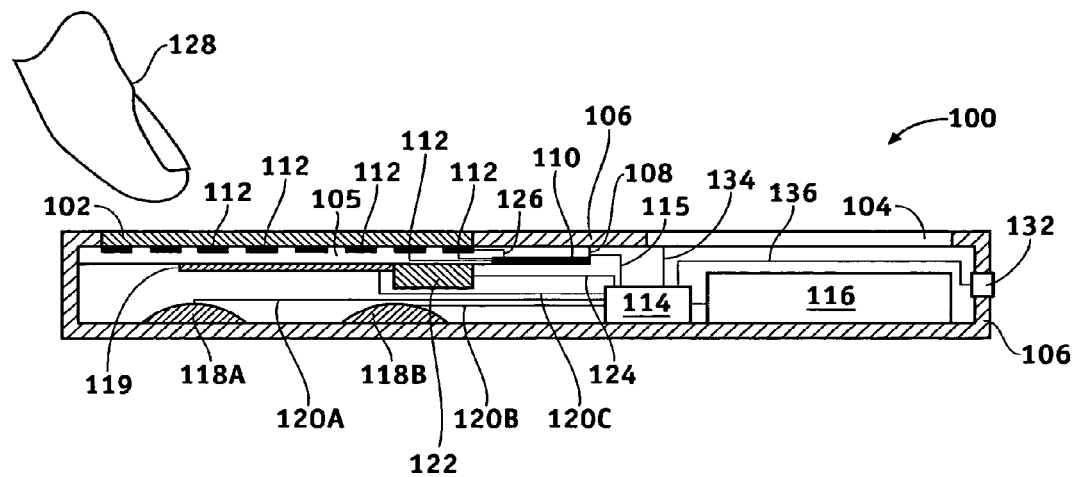
FIG. 1 is a diagram showing a cross-sectional view of an exemplary device that includes force and proximity sensing.
Figure 2A:
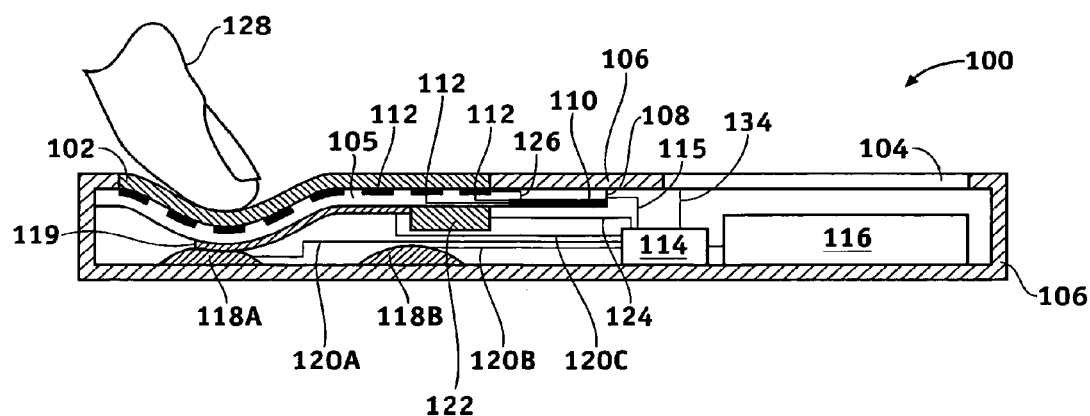
FIG. 2A is a diagram showing a cross-sectional view of an exemplary device when an external force is applied by an object.
Figure 2B:
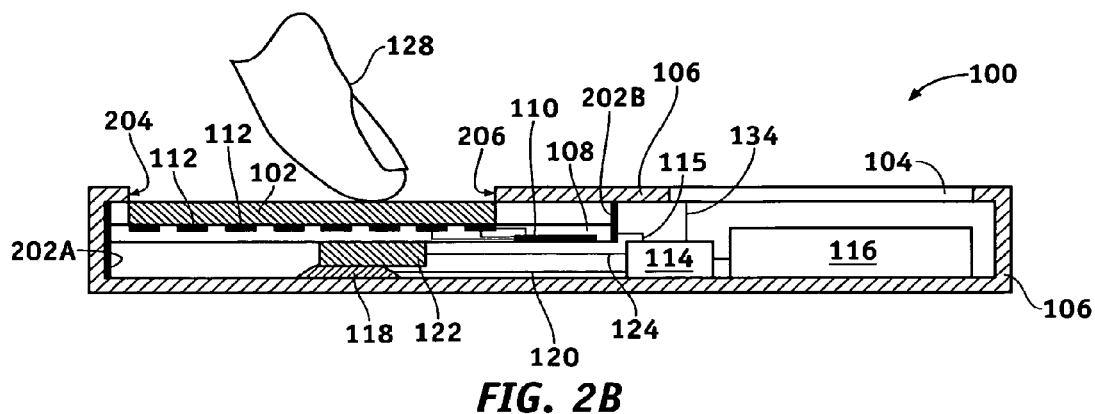
FIG. 2B is a diagram showing a cross-sectional view of an alternate exemplary device when an external force is applied by an object.

Turning now to the drawing figures and with initial reference now to FIGS. 1 and 2A-B, an exemplary device 100 capable of processing user input applied at or near a sensing region 102 by an object 128 suitably includes a proximity sensor 105 and one or more force sensors 118A-B, 119 communicating with a processor 114. Depending upon the particular implementation, processor 114 may interact with an optional storage device 116, an optional display 104, an optional external interface 132 and/or the like to carry out any appropriate function. In a conventional media player implementation, for example, device 100 may include a disk drive, flash memory or other storage device 116 capable of storing media data. As the media files are played for the user (e.g. via an audio/video decoder or the like), information such as track name, artist and/or the like may be presented on display 104, on another display associated with an external host coupled to device 100 via interface 132, and/or the like. While the invention is frequently described herein with reference to a media player for purposes of simplicity and clarity, equivalent structures and concepts could be applied to any other electronic device such as any type of portable media system, personal digital assistant (PDA), handheld computer, laptop or desktop personal computer, mobile telephone, peripheral input device, video game player or controller, remote control, input device and/or the like. The various features described herein may therefore be applied in any manner across many types of equivalent devices 100.

Processor 114 is any component or module capable of receiving inputs from sensors 105, 118A-B, 119, of processing the received data, and of providing appropriate outputs 134, 136 to effect the user's desired operation of device 100. Processor 114 may be implemented with any type of hardware, firmware and/or software logic, and may include associated storage (e.g. storage device 116 and/or other digital storage not shown in FIG. 1) for maintaining data and instructions used in operating device 100. Processor 114 may be implemented with any type of microprocessor or microcontroller, for example, with any associated digital memory or the like for storing program instructions and data in any suitable format.

In the embodiment shown in FIGS. 1 and 2A-B, processor 114 receives force indications 120A-C from force sensors such as snap dome switches 118A-B and/or strain gauge 119 (respectively), and also receives proximity indications 115 from proximity sensor 105. As discussed more fully below, indications 115, 120A-C may be any discrete signals and/or streams of signals that individually or collectively represent user inputs and other information received from sensors 105, 118A-B, 119. Processor 114 also appropriately produces signals 134, 136 that result in user interface features (e.g. scrolling, cursor control, item selection or the like) on display 104 and/or on an external host coupled to device 100 via interface 132, and/or performs other suitable tasks associated with the operation of device 100.

Proximity sensor 105 is any single or combination of capacitive, resistive, inductive or other type of sensor that is capable of detecting the position, proximity and/or other position-based indication 115 of a finger, stylus or other object 128 with respect to sensing region 102 of device 100. Exemplary sensors 105 include the various sensors produced by Synaptics Inc. of Santa Clara, Calif., which appropriately detect a zero dimensional (e.g. presence and non-presence), one dimensional, two dimensional or multi-dimensional position of an object 128 using capacitive or inductive coupling, although many different types of sensors 105 could be used in a wide array of alternate embodiments. Other types of sensors 105 capable of detecting position, proximity or related attributes include sensors based upon acoustic, optical, or electromagnetic properties (e.g. radio frequency, infrared, ultraviolet or the like), and/or any other effects.

As used herein, the term "proximity sensor" is intended to encompass not only conventional touchpad sensors, but also a broad range of equivalent sensors 105 that are capable of detecting the position or proximity of one or more fingers, pointers, styli or other objects 128. Such sensors 105 may include, without limitation, touch screens, touch pads, touch tablets, scroll strips or rings, biometric authentication devices (e.g. fingerprint sensors), handwriting or character recognition devices, and the like. Similarly, the terms "proximity", "position", "object position" and "position-based attribute" as used herein are intended to broadly encompass various types of absolute or relative positional or proximity information as well as other types of spatial-domain information such as speed, velocity, acceleration, and the like, including measurement of motion in one or more directions. Various position-based attributes may also include time history components, as in the case of gesture recognition and the like. Accordingly, many different types of "proximity sensors" 105 may be capable of detecting widely varying "proximity-based attributes" beyond the mere presence or absence of an object 128 in a wide array of alternate but equivalent embodiments.

In the exemplary embodiment shown in FIGS. 1 and 2A-B, proximity sensor 105 is a conventional touchpad-type sensor that includes any number of electrodes 112 and associated processing circuitry 110 disposed upon any type of substrate 108. Substrate 108 may be any flexible or rigid surface capable of supporting circuitry 110 and electrodes 112 and of being conveniently mounted within housing 106 of device 100. In the exemplary embodiment shown in FIG.

1, substrate 108 is implemented with a flexible material (e.g. a polyethylene terephthalate or polyimide film or the like) that permits deformation of sensor 105 during actuation of force sensors 120A-B or 122, as described more fully below. Substrate 108 is typically mounted within housing 106 using, any mechanical, adhesive or other techniques to allow detection of object 128 along or near sensing region 102. Sensing region 102, although shown as a discrete element in FIGS. 102, may simply represent the area near device 102 in which user inputs applied with object 128 can be detected. In various embodiments, region 102 is demarked on device 100 with a touch-friendly surface formed of MYLAR material, plastic, glass and/or the like. In such embodiments, sensing region 102 is typically affixed to housing 106 using an adhesive, mechanical fastener or other technique that prevents dust, moisture and/or other environmental contaminants from entering the interior of housing 106. Although not shown in FIGS. 1 and 2A-B, sensing region 102 may be covered during operation and/or storage of device 100 in various embodiments. Various types coverings (e.g. dustcovers, flip covers, pouches, wallets, scratch protectors and/or the like) may be present during operation of device 100, or may be intended to be removed prior to operation. Accordingly, object 128 need not come into direct contact with sensing region 102 to apply inputs in all embodiments.

Although sensor 105 may be implemented in any manner, a conventional capacitive touchpad-type sensor 105 includes one or more electrodes 112 that detect changes the proximity of object 128 along or near sensing region 102 by sensing changes in electrical capacitance due to the presence of object 128. Generally speaking, the two predominant techniques for capacitively sensing the proximity of object 128 involve detecting either the capacitance between the object and one or more electrodes (which generally increases as object 128 approaches the sensing electrode 112), or detecting the capacitance between two or more electrodes 112. In the latter case, a carrier signal is typically applied at a first electrode 112 and received at a second electrode 112. As the detected object 128 approaches either electrode, the capacitance of the transmitted signal is affected. In either case, a proximity indication 115 may be determined by monitoring changes in capacitance observed by the electrodes 112 over time. An example of a conventional technique for capacitively sensing and processing object position in a touchpad is set forth in detail in U.S. Pat. No. 5,880,411, although any other sensing techniques could be used in a wide array of alternate embodiments.

Force sensors 118A-B, 120 are any single or combination of devices, components, circuitry or the like capable of detecting the application of physical force. Examples of force sensors that may be used in various embodiments include mechanical switches such as binary/multi-level switches, analog switches, individual or sets of strain gauges, and/or the like. In the exemplary embodiment shown in FIGS. 1 and 2A-B, sensing region 102 is initially mechanically or otherwise biased into a non-deformed position (shown in FIG. 1) when no force is exerted by object 128. As object 128 exerts physical force against sensing region 102 (as shown in FIGS. 2A-B), however, sensing region 102 moves and/or otherwise responds in any manner that creates a force against one or more switches 118A-B and/or that creates mechanical strain detectable by sensor 119. Sensing region 102 can manifest a response to physical force through any sort of strain, deformation, rotation, translation, other movement and/or the like. In the exemplary embodiment shown in FIG. 2A, for example, sensing region 102 and proximity sensor 105 are designed to be flexible such that force applied by object 128 results in detectable physical deformation of the sensing region 102 itself. Alternatively, sensing region 102 and/or proximity sensor 105 may be designed more rigidly (e.g. sensor 105 may be formed on a plastic or other rigid substrate 108) to create physical translation and/or rotation of sensing region 102 in response to applied force. In the exemplary embodiment shown in FIG. 2B, for example, sensing region 102 is allowed to translate along one or more guides 202A-B when force is applied by object 128. In still other embodiments, sensing region 102 and/or proximity sensor 105 are hinged to housing 106 (e.g. along faces 204 or 206) to allow rotational movement with respect to the hinged point. In still other embodiments, sensing region 102 and/or proximity sensor 105 may be allowed to pivot about a fulcrum or other support point provided below sensing region 102, thereby allowing for application of physical force on one or more force detectors 118, 119 suitably arranged with respect to the pivot point. The particular mechanical structures and arrangements of device 100 may therefore vary significantly from embodiment to embodiment.

In any of the cases identified above, force sensors 118A-B and/or 119 provide appropriate force indications 120A-C to processor 114 to indicate the presence of physical force applied against sensing region 102. Although FIGS. 1 and 2A show two types of force sensors (corresponding to snap dome-type switches 118A-B and a strain gauge 119) present within device 100, in practice only one type of force sensor need be present in a particular embodiment. Snap dome switches 118A-B, for example, typically provide simple binary output 120A-B that indicates whether the switch is in an actuated state (e.g. switch 118A in FIG. 2A or switch 118 in FIG. 2B) or a non-actuated state (e.g. switch 118A in FIG. 1). Strain gauge 119 may be configured to provide an analog indication 120C that indicates the amount of force applied; alternatively, a simple binary indication 120C could indicate the presence or absence of force as appropriate. Various other types of force sensors 118A-B, 119 could be incorporated into a wide array of alternate embodiments; similarly, the numbers and spatial arrangements of the various sensors could be modified in many different ways to detect physical force applied against any portion of sensing region 102 in any manner.

Various embodiments of device 100 optionally include a feedback device 122 that provides physical feedback to object 128 in any suitable manner. Feedback device 122 may be any type of haptic feedback device, for example, such a piezoelectric or other electro-mechanical actuator that provides mechanical force in response to electrical signals 124 provided by processor 114. Such haptic feedback can improve the user experience by providing a tactile response to force and/or proximity inputs applied by object 128. Such tactile response could be provided by vibrating or "thumping" the underside of sensing region 102, for example, to acknowledge inputs applied by object 128 or to provide a frame of tactile reference to the user during input. That is, periodic "thumping" of the sensing region could be used to provide an indication that a unit of scrolling had been traversed, that an end of a scroll list had been reached, or to provide other feedback to the user. The particular types of feedback provided and the techniques for providing feedback may vary significantly between embodiments, as may the structural design and/or location of the feedback device 122 itself. Feedback device 122 may be incorporated as part of force sensor 119, for example, to allow for "localized" compensation for force applied and ready distinguishing of physical force applied from force received. For example, in one embodiment, feedback device 122 and force sensor 119 may be one single mechanical switch that provides feedback when pressed, such as a snap-dome switch. In another embodiment, feedback device 122 and force sensor 119 can also include a piezoelectric component that produces an electrical response when deflected to indicate force applied or deflects to provide feedback when electrically driven. Again, the particular details of implementation could vary significantly across different types of devices 100 in a wide array of alternate but equivalent embodiments.

In operation, then, processor 114 suitably receives force and proximity indications 120A-C and 115 (respectively) to indicate the application of user input by object 128. These indications 115, 120A-C may be provided and received in any manner, using any types of encoded or unencoded digital or analog signals. Indications 115, 120A-C may be provided as relatively continuous data streams, for example, with proximity and/or force data extracted from each data stream by processor 114 as needed. Alternatively, indications 115, 120A-C may be provided as discrete signals that indicate changes in the proximity or force of object 128. In either case, indications 115, 120A-C may transfer information in any manner, including any real-time, synchronous, asynchronous, batch processed, polled or other temporal manner, and using any form of signal encoding or the like.

Processor 114 suitably receives and processes proximity indications 115 and force indications 120A-C as appropriate for the current operating mode of device 100, and/or to switch the operating mode of device as described below. In addition, processor 114 typically carries out the various conventional operating functions of the device 100, including generation of user interface displays on display 104 and/or on an external host coupled via interface 132. While FIGS. 1 and 2A-B show processor 114 as separate from proximity-sensing circuitry 110, in practice the various structures and processes carried out by the two modules could be logically and/or physically combined. That is, in various equivalent embodiments to those shown in FIGS. 1 and 2A-B, proximity sensor 105 includes a sensor processor 110 that may supplement or replace some or all of the functions carried out by device processor 114 as described above. Force indications 120A-C, for example, could be provided to sensor processor 110 rather than being directly provided to device processor 114. In such embodiments, sensor processor 110 may provide a hybrid indication to device processor 114 that includes both force and proximity data as appropriate. Conversely, processing of raw proximity and/or force sensing data could be carried out within processor 114, rather than in separate circuitry 110. The various structures and features described above and shown in the figures, then, may be modified or augmented substantially in alternate embodiments.

Figure 3:
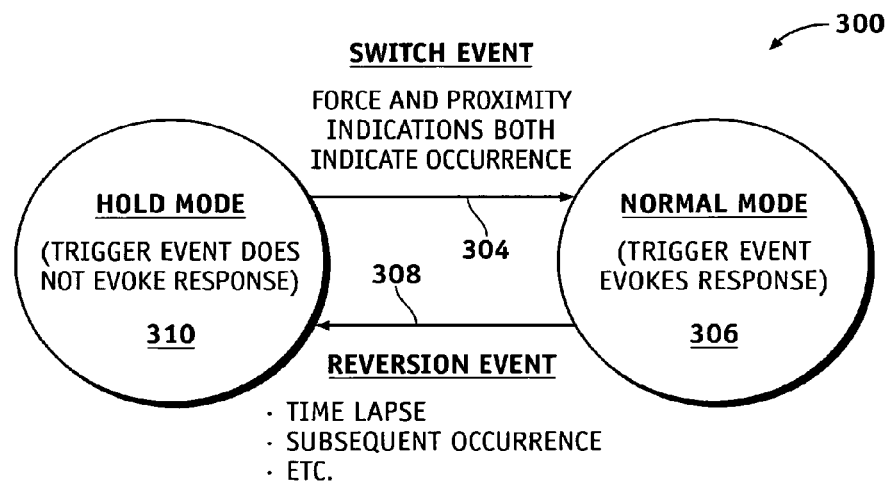
FIG. 3 is a state diagram showing an exemplary technique for processing input in a device.

Turning now to FIG. 3, structures such as those described above may be readily configured to implement a multi-modal system 300 that includes a normal operating mode 306 and a special operating mode 310 as appropriate. "Operating modes" 306 and 310 in this sense simply refer to two different modes of responding to any trigger event. That is, a trigger event is processed differently in one operating mode 306 than in the other operating mode 310.

In various embodiments, certain force or proximity indications may be considered to be trigger events that are processed differently in one operating mode than in another. In a "normal" operating mode 306, for example, proximity indications 115 may be processed to provide scrolling, cursor control and/or other user interface features. Force indications 120 may be similarly processed in the normal mode to respond to button pushes or the like. When device 100 is in an operating mode 306 that provides a response to proximity or force trigger events, this response may incorporate item selection, cursor motion, menu navigation, scrolling, variation of a control value (e.g. increasing or decreasing a volume, tone, screen brightness or other parameter), and/or other features as appropriate. In "hold" mode 310, however, certain processing of input indications 115, 120 may be suppressed or altered as appropriate to prevent accidental processing of accidental or unintentional input. The "hold" mode 310 in this embodiment therefore simulates the activation of a conventional mechanical hold switch in that it provides a ready mechanism for ignoring unintended or accidental inputs while the hold mode is active.

While "hold switch" functionality may be practiced in many different ways, an exemplary technique for processing user inputs applied with object 128 and detected at or near sensing region 102 suitably includes the broad steps of receiving proximity indications 115 and force indications 120 as described above, identifying an occurrence of the user input being indicated by both the force and proximity indications, and switching the operating mode of device 100 in response to the detection of such an occurrence such that the device responds differently to trigger events in the various operating modes (e.g. modes 306, 310). As described above, proximity indications 115 and force indications 120 may be received at processor 114 and/or any other processing module in any manner. In various embodiments, indications 115 and 120 are provided as one or more electrical signals that can be received at any discrete time and/or over any period of time. Force indication 120, for example, may be a simple "open" or "closed" indication from a binary switch (e.g. snap domes 118A-B), or may be a more detailed indication of the amount of force detected (e.g. from strain gauges 119, a multi-level switch, and/or the like). Similarly, proximity indication 115 may be any discrete signal or stream of signals that indicate position, proximity or other spatial-based quantity of object 128 with respect to sensing region 102.

Detection of an occurrence or other switching event 304 may take place in any manner, and according to any suitable parameters. In various embodiments, the proximity indication 115 and the force indication 120 are each monitored upon receipt to detect the presence of user input at or near sensing region 102. In some embodiments, force input and proximity inputs may be optionally detected within a substantially coincident time. "Substantially coincident" in this sense means that the two indications 115 and 120 need not be perfectly coincident, but may occur within some appropriate timeframe, such as within a second or so of each other. Suitable timeframes may vary significantly from about zero to about ten or more seconds in various embodiments. In other embodiments, temporal constraints upon the detection of user input with both indications 115 and 120 are relaxed or eliminated entirely. As an example, a user may apply proximity input (e.g. for scrolling or cursor motion) along sensing region 102 for some period of time before applying sufficient force to activate a force indication 120. In such embodiments, an occurrence of both indications 115, 120 indicating user input could be detected, thereby enabling the switching of the operating mode if appropriate.

Device 100 may be initially placed in any state (e.g. normal mode 306 or special mode 310), and transitions between modes 306, 310 may take place in any manner. FIG. 3 shows two examples of modal transitions corresponding to a mode switching event 304 and a mode reversion event 308. Upon an occurrence 304 of user input being indicated by both the proximity indication 115 and the force indication 120, the processing module switches the operating mode of device 100 as appropriate (e.g. between mode 310 and mode 306 to "unlock" user input mode functionality and/or other features). By detecting user input with both indications 115, 120, the processing module can be relatively confident that the input is applied by the user (since the proximity indication 115 is typically only triggered by input from a stylus, finger or other appropriate input object 128), and that the input is intentional (because the input object 128 is applying sufficient force that an accidental touching is unlikely). By detecting both force and proximity input, then, deliberate inputs by the user can be readily distinguished from accidental "bumping" of device 100 or accidental brushing of object 128 near sensing region 102, thereby leading to a high level of confidence that the sensed user input is intentionally applied. This confidence makes the applied input particularly suitable for mode switching, including toggling between a "hold" mode 310 and a "normal" operating mode 306, and may have other applications as well. Upon detection of an occurrence 304 of user input as indicated by both proximity indication 115 and force indication 120, the operating mode may be switched as appropriate.

Although some embodiments will implement a mode in which force or proximity inputs are ignored or otherwise suppressed (e.g. hold mode 310), this is not required in all embodiments. Force and proximity indications 120, 115 may undergo some processing within processor 114, circuitry 110 and/or like, for example, even though the indications are not used to create user interface displays or other responses. Proximity indications 115 may be processed even during "hold" mode 310, for example, to provide sensor calibration, detection or avoidance of environmental noise, and/or other features as appropriate. While at least one response to certain trigger event(s) takes place in certain modes but not in others, other responses or other processing of one or more trigger events may nevertheless take place in such modes. Further, indications received prior or during the modal change may be incorporated into responses processed after the mode change in certain embodiments. Processing of proximity inputs (for example) during an active mode could involve processing proximity indications 115 that represent user inputs applied before the device was switched into the active mode. Stated another way, a response occurring after a modal change may incorporate information received during or prior to the modal change itself. A portion of a gesture, scrolling input or the like represented by proximity indication 115, for example, may be received during or prior to receipt of force indication 120. The pre-occurring proximity indications 114 may nevertheless be used in completing and processing the gesture, scroll or other action as appropriate.

The particular trigger events identified and the responses provided to such events are not limited to "hold switch"-type functions, and may vary widely from embodiment to embodiment. In some implementations, for example, one operating mode may suppress responses to only force inputs, yet allow proximity inputs. Conversely, device 100 could respond to proximity inputs in one mode but not in another. Alternatively, modal changes could be used to activate/deactivate feedback device 122, display 104, interface 132, and/or device 100 itself, and/or to activate any other switchable features, such as the "window display" mode described below. Further, devices 100 need not be limited to two operating modes that are switchable by steps 304-306; to the contrary, three or more modes may be present in any number of devices.

The detection of user inputs on both force indication 120 and proximity indication 115 need not be the only event that results in a modal change on various devices 100. To the contrary, modal changes may take place in response to any technique in addition to those described herein. While reversion event 308 shown in FIG. 3 is intended as an optional feature that may not be present in all embodiments, it may be beneficial on some devices 100 to manually or automatically revert to an original operating mode or to switch to a different operating mode according to other parameters or techniques.

After a user switches the operating mode from hold mode 310 to normal mode 306, it may be desirable to revert to the original operating mode at a subsequent time, as shown by reversion event 308 in FIG. 3. Device 100 may automatically revert to the original mode after some period of time, or reversion may take place in response to subsequent user inputs or other factors. Automatic reversion could take place after some period of time following the initial mode switch, for example, or could take place when no force, proximity and/or other relevant input is applied for some predetermined period of time. In embodiments wherein the device is initially in a "hold" mode but is subsequently switched to a "normal" input mode, device 100 may automatically revert to "hold" mode when no user input is applied for some period of time. The particular period of time may vary significantly from a very short period (e.g. on the order of a few seconds) to a relatively long period (e.g. several minutes, hours or more) depending upon the particular implementation. Further, the period of time may be optionally configurable by a user to allow for automatic reversion after a particularly desired time, and/or to disable automatic reversion if the user does not desire this feature.

Alternatively or additionally, subsequent mode switching may take place in response to inputs received at device 100. A subsequent occurrence of user input being indicated by both the proximity indication 115 and force indication 120, for example, could trigger a subsequent modal change or reversion 308 to the original operating mode. Other modal changes could be triggered solely by force indications 120, proximity indications 115, other inputs received at the processing module, and/or the like.

To summarize the exemplary system 300 shown in FIG. 3, then, a device 100 suitably switches from a second operating mode (e.g. a hold switch mode 310) into a first operating mode (e.g. a normal input mode 306) in response to an occurrence 304 of the user input applied by object 128 being indicated by both the force indication 120 and the proximity indication 115. In the first operating mode, a response is made to certain trigger events (e.g. inputs identified by force indication 120, proximity indication 115 and/or the like) that is not made in the second operating mode. After the device is manually and/or automatically switched back to the first operating mode, response is no longer made to the corresponding trigger events. Although FIG. 3 shows system 300 as beginning in a "non-responding" mode and subsequently switching to a "responding" mode, equivalent embodiments effectively swap modes 306 and 310 to implement a device 100 that is initially in a "responding" mode, but enters a "non-responding" mode in response to the switching occurrence 304. Other modifications and/or enhancements to the process, many of which are set forth above, may be incorporated in a wide array of equivalent embodiments.

Although the various steps and features of system 300 may be implemented using hardware, firmware and/or software modules executing within processor 110, circuitry 114 and/or other computing resources as appropriate, it should be understood that FIG. 3 is intended as a logical representation of a multi-modal system 300 rather than a literal software implementation. As such, the particular data structures, programming routines and the like may vary from those shown in the figure without departing from the scope of the concepts described herein. The processing modules implementing the various features of system 300, for example, may be stored in source or object code form on any sort of digital storage medium, such as any digital memory (e.g. any static or dynamic RAM, flash memory, ROM or the like), any mass storage device (e.g. any magnetic, optical or other storage device) and/or any portable storage media (e.g. CD-ROM, floppy disk, flash memory). The various steps or modules of various implementations may be similarly stored in any networked environment and/or transmitted across any communications medium using any type of signal(s) modulated on a carrier wave. System 300 and its various components may therefore be modified or supplemented in myriad ways, and may be implemented in any manner.

Figure 5:
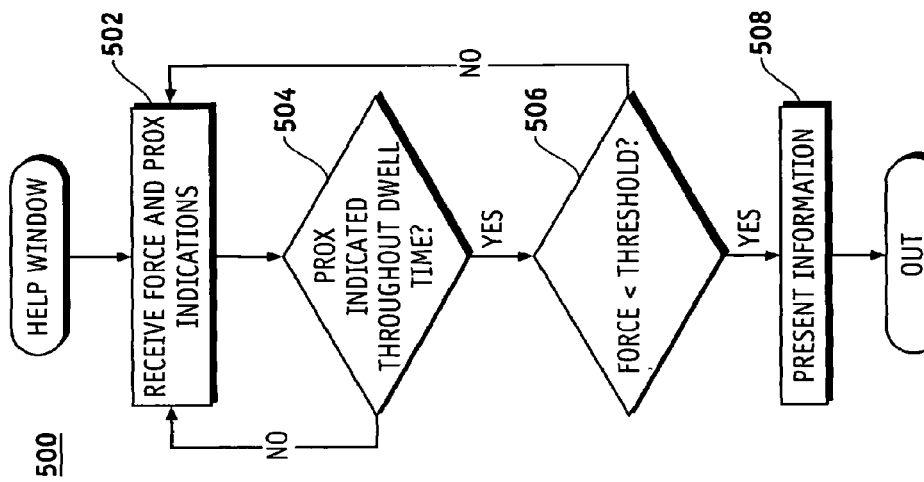
FIG. 5 is a flowchart of an exemplary process for presenting information in response to force and proximity indications.

To that end, proximity and force indications 115, 120 may be additionally or alternatively processed to implement other features beyond those described above, including the display of information relative to user inputs. An exemplary device 100 showing this optional feature is presented in FIG. 4, and an exemplary technique 500 for implementing optional information displays is shown in FIG. 5. This information display technique 500 may be used to enhance the modal switching described above, and/or may be separately implemented in various alternate embodiments.

Figure 4:
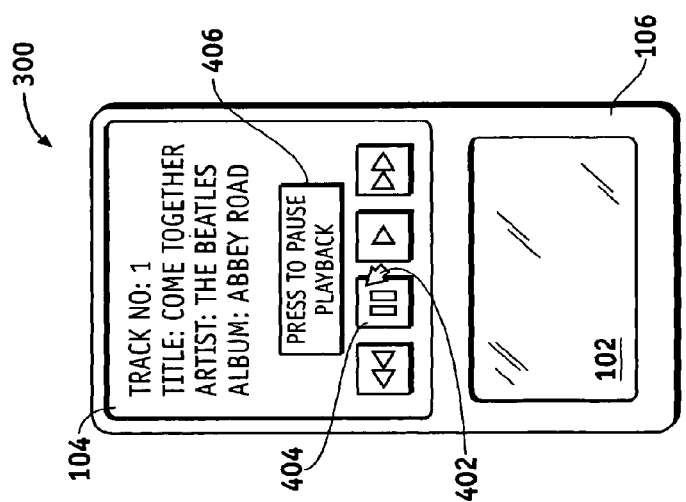
FIG. 4 is a front view of an exemplary device that is capable of displaying a "help window" in response to force and proximity indications.

With reference now to FIG. 4, an exemplary device 100 suitably receives force and proximity inputs from an input object 128 (FIG. 1) along a sensing region 102. FIG. 4 shows sensing region 102 as a touch surface that is sealed or otherwise mounted to a front surface of housing 106. As force and proximity inputs are applied by object 128 with respect to region 102, a user interface presented on display 104 is appropriately updated. Proximity inputs received at proximity sensor 105 (FIG. 1), for example, could result in movement of cursor 402 on display 104, whereas force inputs received at force sensors 118A-B, 119 (FIG. 1) could result in selection of a button (e.g. button 404) in proximity to cursor 402 in a simple "point-and-click" interface that is familiar to many users. The exemplary information shown on display 104 in FIG. 4 and the interface technique described herein is purely for purposes of illustration, and is not intended to limit the concepts described herein in any way.

In various embodiments, information windows (e.g. window 406 in FIG. 4) could be presented to the user under appropriate conditions to provide useful information or to assist the user in any suitable manner. Such windows may provide information about an interface item (e.g. button 404) indicated by cursor 402, for example. In the exemplary display 104 of FIG. 4, window 406 provides information about button 404 in response to proximity of cursor 402 to button 404. With primary reference to FIG. 5, such a window 406 may be presented (step 508) in response to cursor 402 remaining fixated upon the location of button 402 for an appropriate time (step 504) without the force indication 120 indicating that the user has selected the button (step 506). Stated another way, if the force and proximity indications 120, 115 received in step 502 indicate that the cursor 402 "dwells" in a particular region of display 104 associated with an interface element 404 for a period of time without selection by the user, device 100 suitably presents additional information on display 104 to assist the user. The particular dwell time (step 504) in which the proximity indication 115 remains substantially unchanging varies from embodiment to embodiment, as does the threshold amount of physical force determined in step 506. The particular process 500 shown in FIG. 5 may be supplemented or modified as appropriate to present any relevant information (step 508) under appropriate circumstances. The information presented need not be related specifically to the interface element 404 indicated by cursor 402, for example, but may be simply generic information relevant to device 100, the current operating mode of the device, and/or the like. The information displayed could simply instruct the user to apply sufficient force to make a selection, for example, if conditions (e.g. step 506) warranted such feedback. Information could be presented, for example, if the force applied by the user is zero or otherwise below an appropriate threshold in step 506. In other embodiments, the information presented in step 508 could be presented in response to force and/or proximity indications 120, 115 received during a "hold switch" mode as describe above to remind the user of the current mode of the device and/or to instruct the user to switch the operating mode before applying subsequent inputs. The particular information displayed and the conditions leading to such display therefore vary widely from embodiment to embodiment.

Accordingly, there are provided numerous systems, devices and processes for implementing modal changes in a device based upon force and proximity indications. While at least one exemplary embodiment has been presented in the foregoing detailed description, it should be appreciated that a vast number of equivalent variations exist. The various steps of the techniques described herein, for example, may be practiced in any temporal order, and are not limited to the order presented and/or claimed herein. It should also be appreciated that the exemplary embodiments described herein are only examples, and are not intended to limit the scope, applicability, or configuration of the invention in any way. Various changes can therefore be made in the function and arrangement of elements described herein without departing from the scope of the invention as set forth in the appended claims and the legal equivalents thereof.

What is claimed is:

1. A processing system for an input device, the processing system configured to:
   while in a first operating mode, receive a first force indication from a force sensor, receive a first proximity indication from a proximity sensor and provide a first response based on one of the first force indication and the first proximity indication indicating input user occurrence,
      wherein when only one of the first force indication and the first proximity indication indicate input user occurrence, the processing system provides the first response, and
      wherein when both of the first force indication and the first proximity indication indicate input user occurrence, the processing system provides the first response; and
   while in a second operating mode, receive a second force indication from the force sensor, receive a second proximity indication from the proximity sensor, and provide a second response when both the second force indication and the second proximity indication indicate input user occurrence and wherein when only one of the second force indication and the second proximity indication indicate input user occurrence, the processing system does not provide the second response.

2. The processing system of claim 1, wherein the second response comprises switching from the second operating mode to the first operating mode.

3. The processing system of claim 1, wherein the first response comprises a user interface feature.

4. The processing system of claim 1, further configured to calibrate at least one of the proximity sensor based on proximity indication and the force sensor based on the force indication while in the second operating mode.

5. The processing system of claim 1, wherein the second response comprises at least one of activating a feedback device, display device, or the input device.

6. The processing system of claim 1, wherein the second response is further based the force indication and proximity indication occurring at a substantially coincidental time.

7. The processing system of claim 1, wherein the proximity sensor comprises a capacitive sensor configured to detect a change in capacitance between a first sensor electrode and a second sensor electrode.

8. The processing system of claim 1, wherein the proximity sensor comprises a capacitive sensor configured to detect a change in capacitance between a sensor electrode and an input object.

9. The processing system of claim 1, wherein the processing system drives a feedback device based on at least one of the first response and the second response.

10. An input device comprising:
a proximity sensor;
a force sensor; and
a processing system coupled to the proximity sensor and the force sensor, the processing system configured to:
while in a first operating mode, receive a first force indication from the force sensor, receive a first proximity indication from the proximity sensor and provide a first response based on one of the first force indication and the first proximity indication indicating input user occurrence,
wherein when only one of the first force indication and the first proximity indication indicate input user occurrence, the processing system provides the first response, and
wherein when both of the first force indication and the first proximity indication indicate input user occurrence, the processing system provides the first response; and
while in a second operating mode, receive a second force indication from the force sensor, receive a second proximity indication from the proximity sensor, and provide a second response when both the second force indication and the second proximity indication indicate input user occurrence and wherein when only one of the second force indication and the second proximity indication indicate input user occurrence, the processing system does not provide the second response.

11. The input device of claim 10, wherein the proximity sensor device is a capacitive sensing device.

12. The input device of claim 10, further comprising a feedback device configured to provide feedback in response to at least one of the first response and the second response.

13. The input device of claim 10, wherein the force sensor comprises the feedback device.

14. The input device of claim 10, wherein the processing system comprises a sensor processor, and wherein the processing system is configured to provide the first response and the second response to a device processor.

15. A method of processing user input in an input device, the method comprising:
while in a first operating mode, receiving a first force indication from a force sensor, receiving a first proximity indication from a proximity sensor and providing a first response in response to one of the first force indication and the first proximity indication indicating input user occurrence,
wherein when only one of the first force indication and the first proximity indication indicate input user occurrence, the processing system provides the first response, and
wherein when both of the first force indication and the first proximity indication indicate input user occurrence, the processing system provides the first response; and
while in a second operating mode, receiving a second force indication from the force sensor, receiving a second proximity indication from the proximity sensor, and providing a second response in response to both the second force indication and the second proximity indication indicating input user occurrence and wherein in response to only one of the second force indication and the second proximity indication indicate input user occurrence, the second response is not provided.

16. The method of claim 15, wherein the second response comprises switching from the second operating mode to the first operating mode.

17. The method of claim 15, wherein the second response is further based on the force indication and proximity indication occurring at a substantially coincident time.

* * * * *